(12) United States Patent
Shi et al.

(10) Patent No.: US 7,449,905 B2
(45) Date of Patent: Nov. 11, 2008

(54) AUTOMATED CHARACTERIZATION SYSTEM FOR LASER CHIP ON A SUBMOUNT

(75) Inventors: Ting Shi, San Jose, CA (US); Daniel Tran, San Jose, CA (US); Pavel Ploscariu, San Ramon, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/674,635

(22) Filed: Feb. 13, 2007

(65) Prior Publication Data

US 2007/0200581 A1 Aug. 30, 2007

Related U.S. Application Data

(60) Provisional application No. 60/773,083, filed on Feb. 13, 2006.

(51) Int. Cl.
*G01R 31/02* (2006.01)
(52) U.S. Cl. .................. 324/760; 324/758; 324/767
(58) Field of Classification Search .................. None
See application file for complete search history.

(56) References Cited

U.S. PATENT DOCUMENTS 6,744,268 B2 * 6/2004 Hollman ................. 324/758

| | | |
|---|---|---|
| 2004/0046578 A1 | 3/2004 | Uher et al. |
| 2005/0123445 A1 | 6/2005 | Blecka et al. |
| 2005/0167587 A1 | 8/2005 | Guevrmont et al. |
| 2005/0213882 A1 | 9/2005 | Go et al. |

* cited by examiner

*Primary Examiner*—Minh N Tang
(74) *Attorney, Agent, or Firm*—Workman Nydegger

(57) ABSTRACT

A temperature-controlled system for testing a laser die mounted on a submount is disclosed. The testing system comprises a base having a motor-driven translation platform. The translation platform includes a first testing site having a two-stage temperature control system mounted on a base portion. The temperature control system includes a thermoelectric cooler and a fluid system for circulating a cooling/heating fluid in a circulation block. A mounting portion is also included on the first testing site on which the submount is positioned. The temperature of the mounting portion is controlled by the temperature control system. A probe card having an arm and an electrical contact portion attached to the arm provides a power supply to the submount when the first testing site is aligned with the probe card. An aligner having a lens assembly that is alignable with the first testing site receives an optical signal produced by the laser.

20 Claims, 8 Drawing Sheets

AUTOMATED CHARACTERIZATION SYSTEM FOR LASER CHIP ON A SUBMOUNT

CROSS-REFERENCE TO RELATED APPLICATIONS

This application claims the benefit of the U.S. Provisional Patent Application No. 60/773,083, filed Feb. 13, 2006, and entitled "Automated Laser Chip on Sub-mount Characterization System," which is incorporated herein by reference in its entirety.

BACKGROUND

1. Technology Field

The present invention generally relates to laser diodes for use in optical communications systems. More particularly, the present invention relates to a testing system that is capable of automatically testing a laser chip coupled to a submount assembly at a variety of temperatures that the laser may be exposed to during use.

2. The Related Technology

Laser diodes and other similar optical sources serve a vital role in optical transmitters, one example of which is an optical transceiver module used in optical data communications. Such laser diodes are employed in the optical transmitter to produce an optical signal onto which data is modulated at a predetermined frequency for transmission via an optical fiber to a specified destination.

Given their important function, the testing of laser diodes is critical to ensure uninterrupted and reliable operation in the field. To that end, each laser diode is typically tested to ensure that it meets with predetermined specifications for acceptable performance. However, such testing is typically performed before the laser diode is mounted to a supporting submount structure, on which the laser will sit once installed in the optical transmitter. Moreover, laser diode testing is often manually performed—a time-consuming and slow process that only serves to increase the overall cost of optical transmitter production. In addition, the laser diode is typically not tested at one or more temperatures that simulate the actual temperature conditions in which the laser diode will operate while part of the optical transmitter.

In light of the above considerations, a need exists in the art for a means by which testing of a laser diode can be provided while the laser diode is mounted to a submount or other suitable surface. Any solution to the above need should include an automated process, whereby the laser diode is tested with a minimum of operator involvement. Further, testing of the laser diode at a plurality of operating temperatures should be enabled so as to simulate real-world conditions.

BRIEF SUMMARY

The present invention has been developed in response to the above and other needs in the art. Briefly summarized, embodiments of the present invention are directed to a temperature-controlled system for testing a laser die mounted on a submount. The testing system comprises a base having a motor-driven translation platform. The translation platform includes a first testing site having a two-stage temperature control system mounted on a base portion. The temperature control system includes a thermoelectric cooler and a fluid system for circulating a cooling/heating fluid in a circulation block. A mounting portion is also included on the first testing site on which the submount is positioned. The temperature of the mounting portion is controlled by the temperature control system. A probe card having an arm and an electrical contact portion attached to the arm provides a power supply to the submount when the first testing site is aligned with the probe card. An aligner having a lens assembly that is alignable with the first testing site receives an optical signal produced by the laser.

A temperature-controlled second testing site and a third testing site are also included in the system to expand temperature-controlled testing options for submount assembly.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1A-5 depict various features of embodiments of the present invention, which are generally directed to a characterization system for testing and characterizing laser diodes and other light sources that can be employed in optical systems, such as optical transmitters, for example. The characterization system is configured to enable testing of a laser diode while mounted to a submount, thereby simplifying the laser testing process. Moreover, the present characterization utilizes one and two-stage temperature-controlled testing sites that enable the laser diode or other suitable light source to be tested at multiple temperatures, thereby simulating real-world conditions in which the laser will be employed. Thus, more reliable testing results are produced, which in turn leads to fewer in-field device failures. In addition, the characterization system employs an auto-aligning stage for optically coupling an optical fiber to the laser diode-under-test. This increases automation of the testing process, thereby reducing human involvement and testing time per device. Thus, the present characterization system represents advances over the known art, including manually aligned systems that lack temperature control features and that cannot test the laser while positioned on its submount.

Figure 1A:
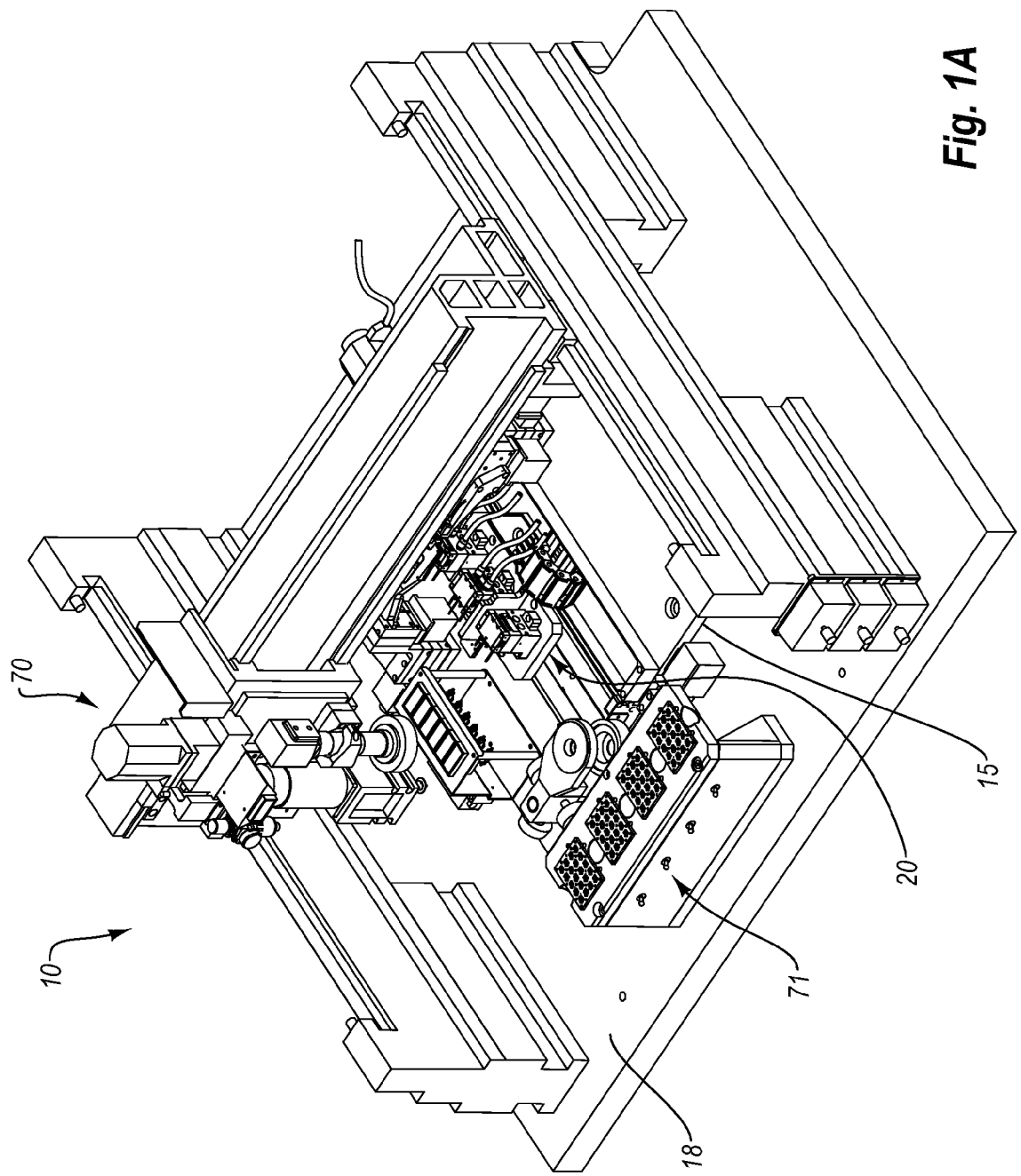
FIG. 1A is a perspective view of an automated laser chip on submount characterization system according to one embodiment of the present invention.
Figure 1B:
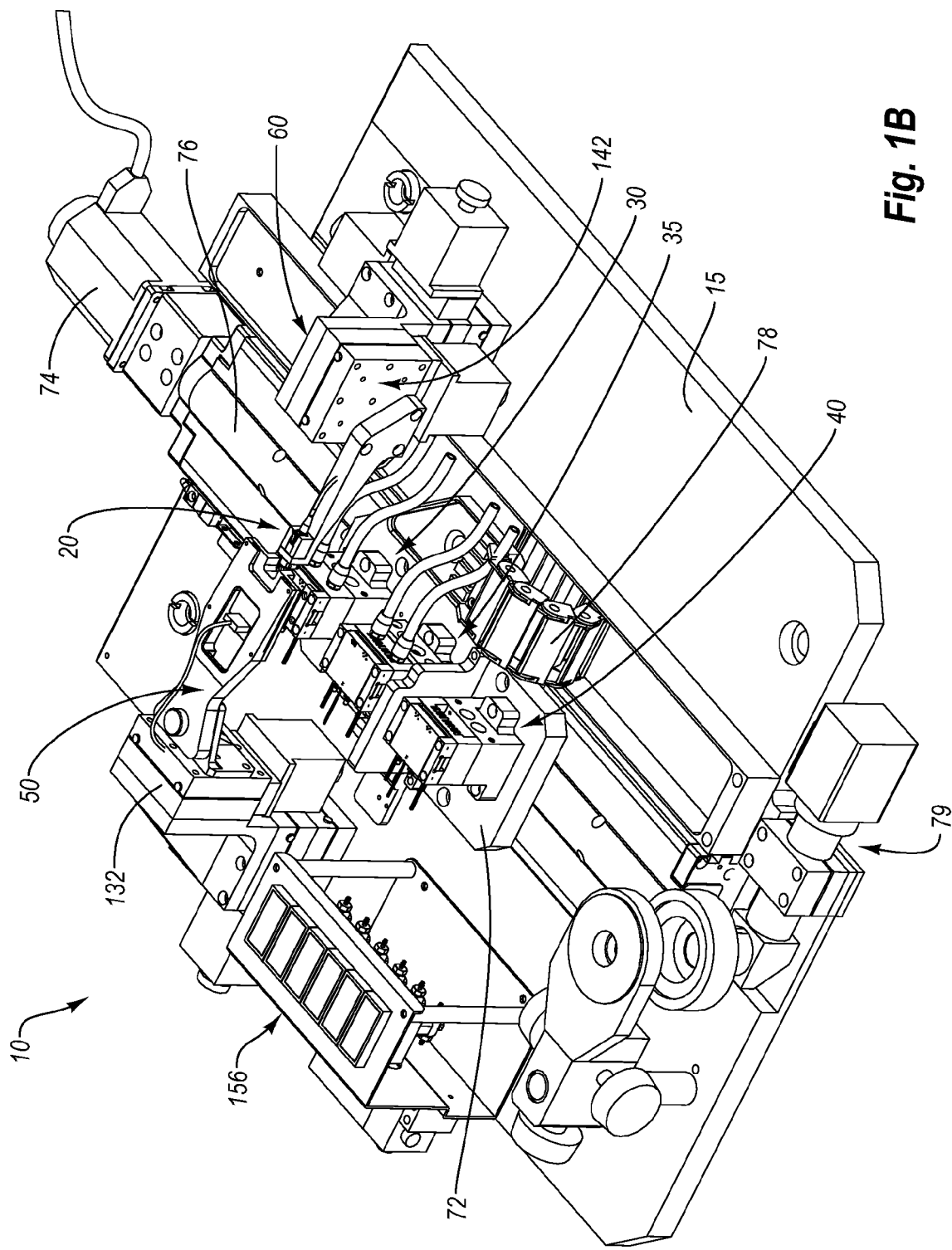
FIG. 1B is a perspective view of a portion of the automated laser chip on submount characterization system of FIG. 1A.

Reference is first made to FIGS. 1A and 1B, which depict in perspective view a laser source characterization system ("system"), generally designated at 10, according to an example embodiment. The system 10 is configured for automated submount-mounted laser die testing using multi-stage cooled and heated testing sites. In particular, the system 10 includes a sub-base 18 supporting a base 15 on which a plurality of related system components is positioned. One of the primary components of the system 10 is an indexer 20, which is configured to support and selectively move a plurality of laser die testing sites, namely, a first testing site 30, second testing site 35, and third testing site 40. Further details regarding each of these sites will be given below. Note that, while it contains three testing sites, the system can alternatively include more or fewer testing sites, if needed or desired for a particular application.

The system 10 includes various other components that are used in characterizing laser dies, including a probe card 50 for providing an electrical supply to the laser die/submount during testing, an aligner 60 that automatically aligns an optical fiber with the laser output during testing, and a four-axis (x, y, z, and rotational) placement robot 70 for pick-and-placement of the laser dies into and out of the testing sites of the system. Additionally, a load/unload station 71 is included that operates in conjunction with the placement robot 70 to facilitate loading and unloading of laser dies to and from the placement robot. In the present embodiment, the placement robot 70 includes a two linear motor driven x and y-stages, a ball screw-driven z-stage and a direct-driven rotary stage, though in other embodiments robots of other configurations could also be acceptably used.

The three testing sites 30, 35, and 40 are configured to be movable in unison by the indexer 20 so as to allow the sites to be positioned as needed with respect to the probe card 50 and aligner 60 during testing. In particular, the testing sites 30, 35, and 40 are mounted on a translational platform 72 of the indexer 20. A motor control 74 is employed to move the platform 72 with respect to the system base 15 via a translation base 76. In this way, any one of the testing sites can be accurately positioned between the probe card 50 and aligner 60 before, during, or after testing. Of course, other indexers or translational systems can be employed to collectively or individually move the testing sites. Note that the system 10 further includes a cable carrier 78 for housing electrical and other cables relating to movement of the translation platform, and a camera assembly 79 for assisting with proper pick and place operations of the laser die between the placement robot 70 and load/unload station 71.

Figure 2A:
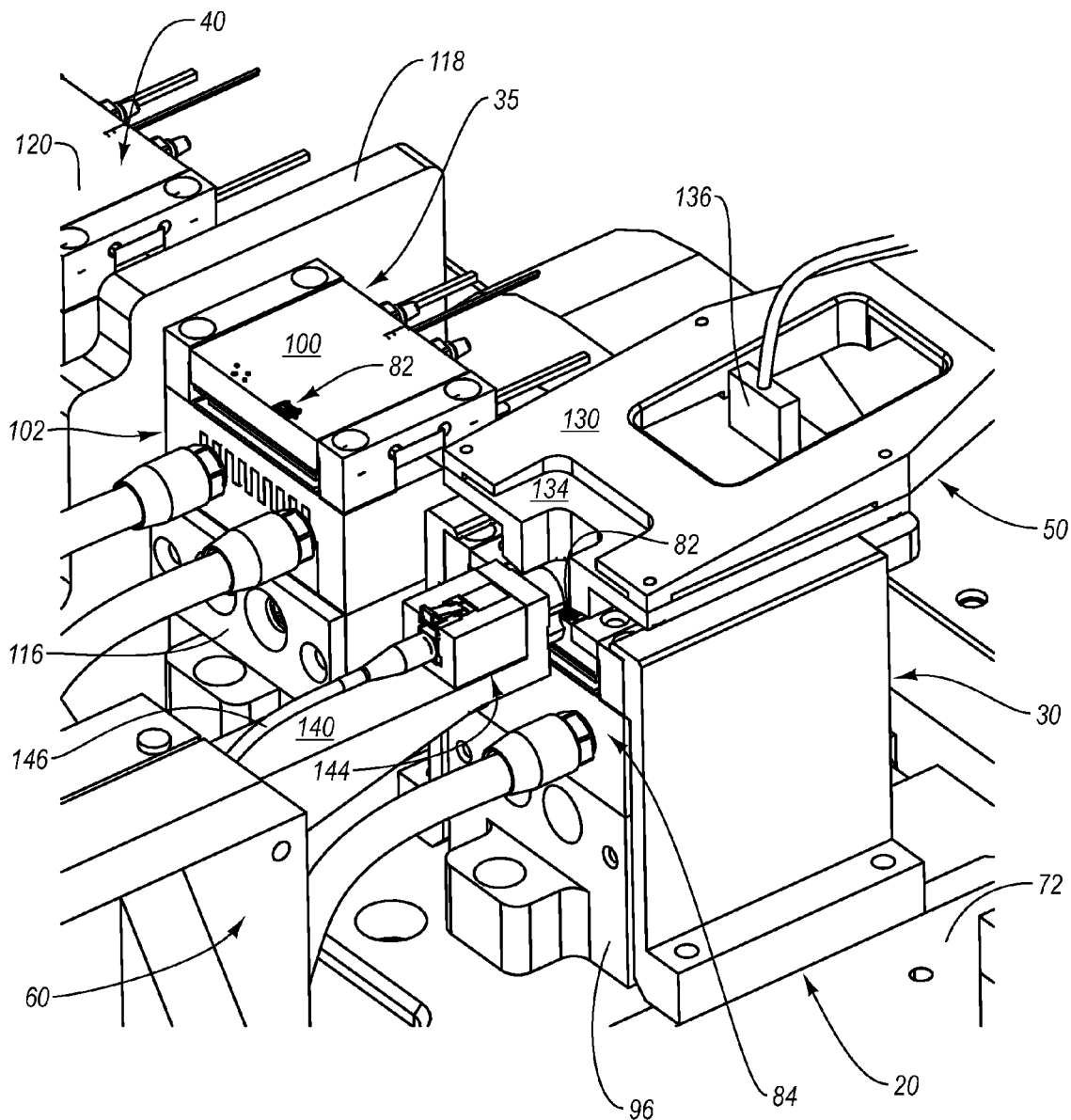
FIG. 2A is a perspective view of first and second testing sites of the characterization system shown in FIG. 1B.
Figure 2B:
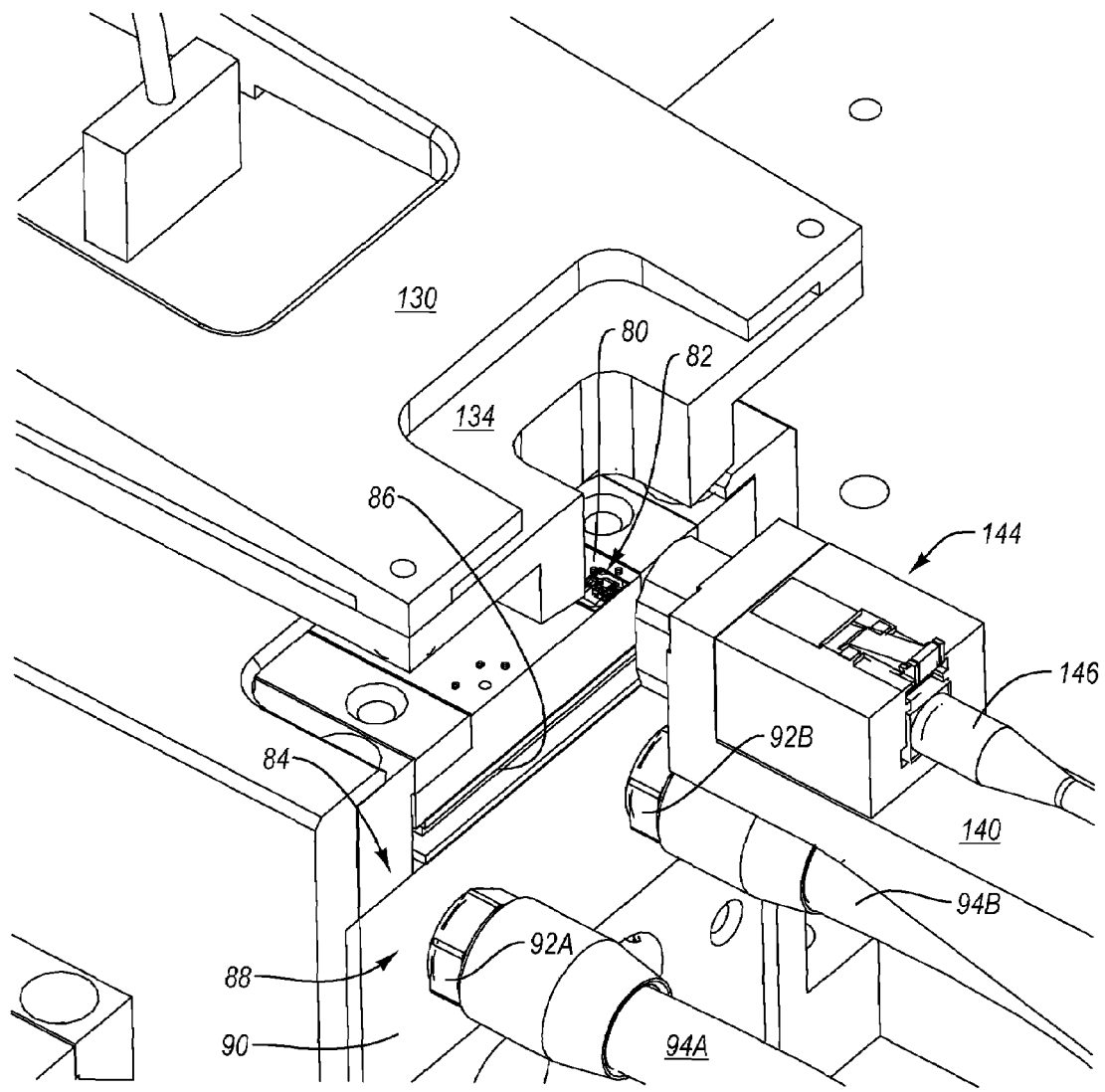
FIG. 2B is a close-up view of the first testing site of FIG. 2A.

Together with FIGS. 1A and 1B, reference is now made to FIGS. 2A, 2B, 3A, and 3B. In greater detail, the first testing site 30 is configured to enable testing of a laser die positioned at the site. Moreover, the testing site 30 is configured to enable the laser die to be tested at one or more of a range of temperatures that can simulate actual operating conditions in which the laser will operate when packaged in a device, such as an optical transmitter. FIG. 2B shows that the first testing site 30 includes a mounting portion 80 on which a submount assembly 82, including a laser die mounted on a submount, is positioned. However, more particular reference is also made to FIG. 3A, which shows a mounting portion 100 associated with the second testing site 35, which also includes a submount assembly 82 positioned thereon, and which is configured substantially similar to the mounting portion 80 of the first testing site 30. As such, reference can be made to FIG. 3A in viewing details of both the mounting portion 80 and mounting portion 100.

The mounting portion 80 in one embodiment includes a predetermined portion on which the assembly 82 can be positioned so as to electrically connect with electrical contacts 150 (FIG. 4) included on the mounting portion 80. The assembly 82 is positioned on the mounting portion 80 such that the probe arm 50 can provide an electrical supply to the submount via the contacts 150 in a manner to be described below and such that light emitted from the submount-mounted laser die during testing can be received by an optical fiber coupled to the aligner 60, as will also be described further below.

The first testing site 30 further includes a temperature control system 84 for altering the temperature of the submount assembly 82 during laser die testing. The temperature control system 84 includes a thermo-electric cooler ("TEC") 86, which acts as a first stage temperature control. Also included is a fluid system 88, which acts as a second stage temperature control for the submount assembly 82.

In greater detail, the TEC 86 is positioned below the mounting portion 80, while the fluid system 88 is positioned below the TEC. The TEC 86 is capable of quickly and precisely altering the temperature of the submount assembly 82 by 0.1 Celsius degree increments. However, the temperature range of the TEC is relatively small when compared with the fluid system 88.

In comparison, the fluid system 88 has a relatively larger range of temperatures achievable, while possessing relatively less precision as to small temperature fluctuations to be achieved in the submount assembly 82. As such, use of the fluid system 88 in conjunction with the TEC 86 results in a possible temperature range of between approximately −40 degrees and 100 degrees C. for the submount assembly 82 with a 0.1 Celsius degree incremental control. In this way, the laser die on the submount assembly 82 can be cooled and heated to one or more of a variety of temperatures during testing. To achieve the above temperature range, the fluid system 88 can include a typical industrial chiller/heater having a liquid circulation block 90. An inlet 92A and outlet 92B are in fluid communication with the chiller/heater. In this way, a cooling or heating fluid can be selectively circulated through the block 90 via the inlet 92A/inlet tube 94A and outlet 92B/outlet tube 94B, thereby enabling heating/cooling, together with the TEC 86 of the mounting portion 80 and submount assembly 82. In one embodiment, the first testing site 30 is used for low temperature testing of the laser die. To avoid icing of the first testing site 30 during such low temperature testing, dry nitrogen gas is delivered to the testing site via the fluid system 88 to prevent undue formation of moisture at the testing site. The fluid system 88 is disposed atop a base 96, as shown.

Figure 3A:
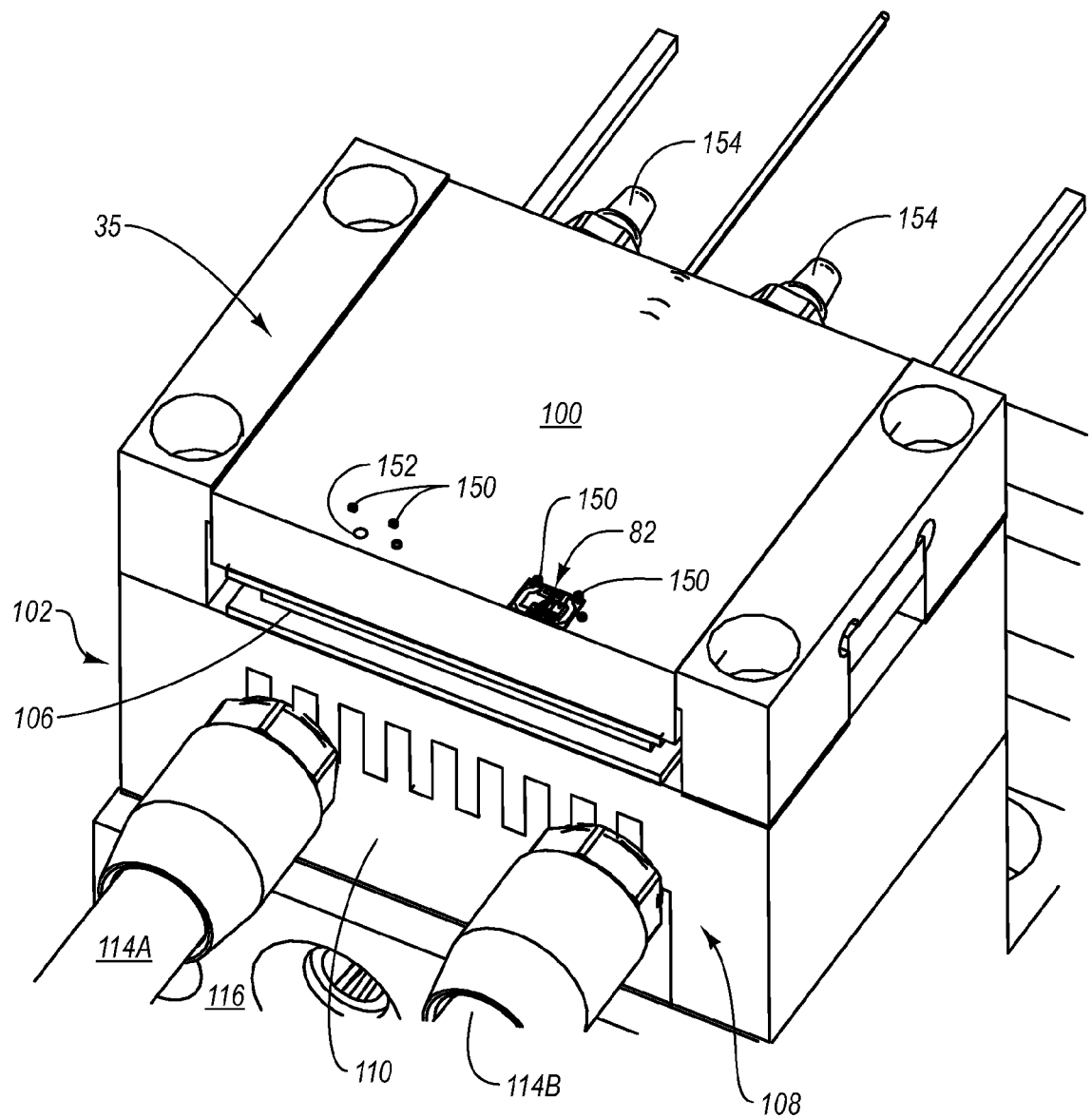
FIG. 3A is a close-up view of the second testing site of FIG. 2B.

FIG. 3A particularly shows the second testing site 35, which serves as another location where a submount assembly, such as the submount assembly 82 shown in FIG. 2, can be positioned for laser die testing. Positioned next to the first testing site 30, the second testing site 35 similarly includes the mounting portion 100 and a temperature control system 102 atop a base 116. The temperature control system 102 includes a TEC 106, and a fluid system 108 having an industrial chiller/ heater, such as a liquid circulation block 110, a fluid inlet 112A, fluid outlet 112B, and accompanying fluid inlet and outlet tubes 114A and 114B. The second testing site 35 is primarily used in one embodiment for high temperature testing of the submount-mounted laser die, though it has the same heating and cooling capabilities of the first testing site 30.

Figure 3B:
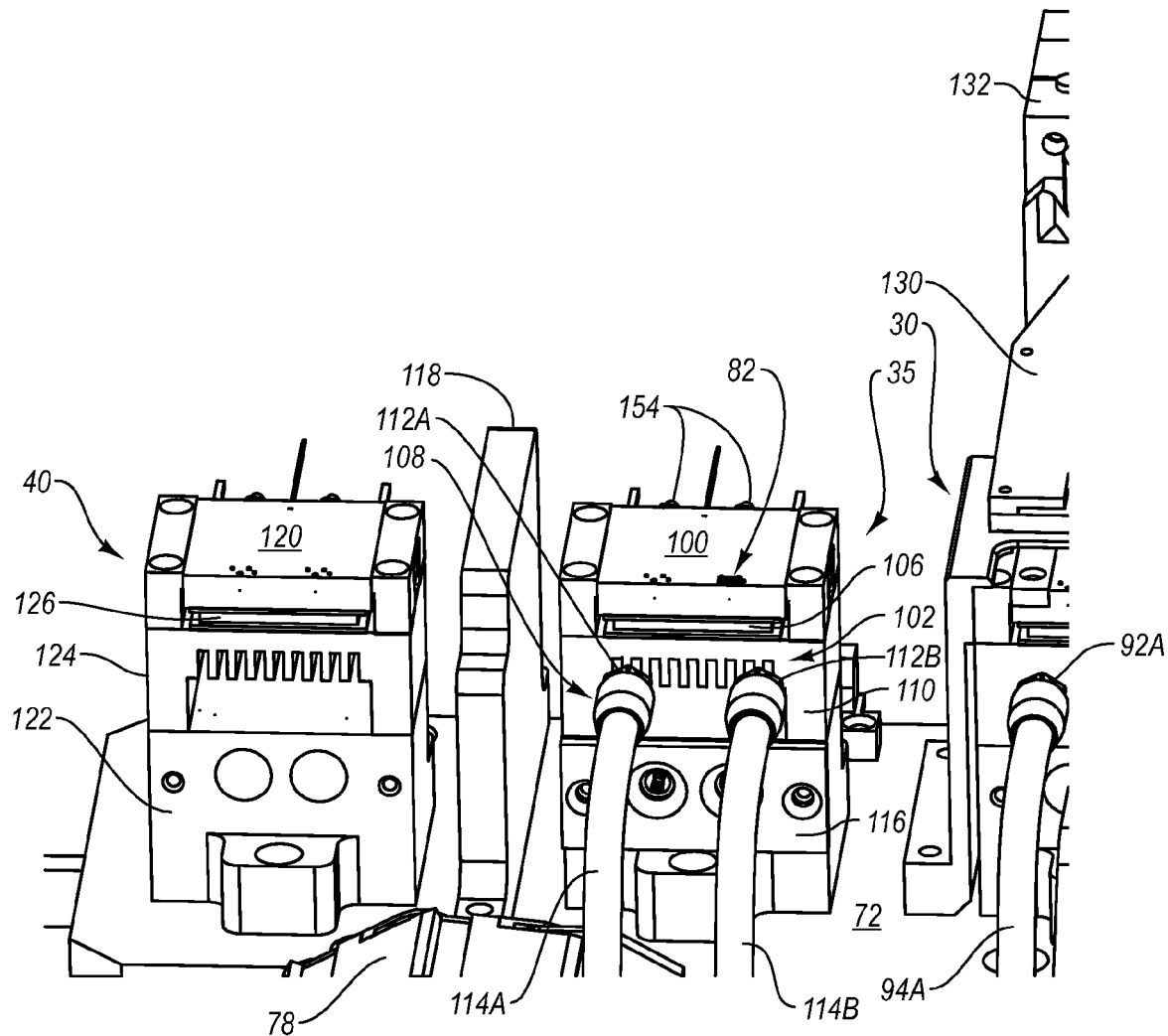
FIG. 3B is a perspective view of the second and third testing sites of the characterization system shown in FIG. 1B.

FIG. 3B shows the third testing site 40 positioned adjacent a divider wall 118 that is disposed between the third testing site and the second testing site 35. As with the other two testing sites, the third testing site 40 includes a mounting portion 120 where a submount assembly can be positioned for testing purposes. In contrast to the other two testing sites, the third testing site 40 in the present embodiment includes a TEC 126 and a cooling fin structure 124 atop a base 122, but no fluid system and liquid circulation block. The third testing site 40 is used in one embodiment for room temperature testing of the laser die.

Configured as discussed above, the system 10 can be used to test a laser die-equipped submount assembly at three distinct temperatures, one temperature at each of the three testing sites 30, 35, and 40, as will be explained further below. As such, the laser die can be evaluated at a range of possible real-world temperature conditions before placement in an actual device to ensure its reliability, thereby resulting in less device failure rates during in-field use. Of course, the system can be configured to include more than three testing sites, if desired.

Figure 5:
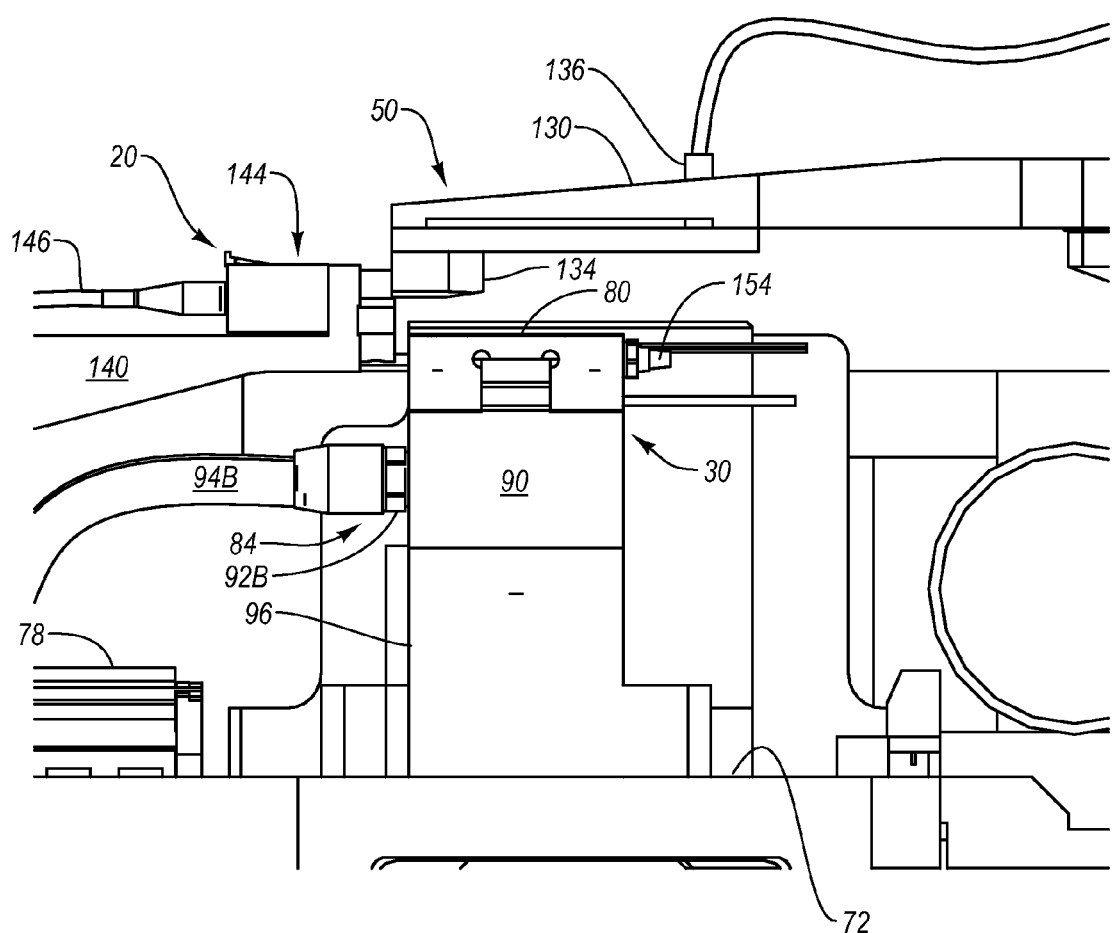
FIG. 5 is a side view of the first testing site and surrounding components of the characterization system as shown in FIG. 1B.

Reference is made to FIGS. 2A, 2B, and 5 in describing various details regarding the probe card 50. As described, the probe card 50 is used to provide proper electrical supply to the submount assembly 82 when positioned on the mounting portion 80 so as to enable the laser die to function and emit light, thereby allowing it to be tested at a predetermined temperature. As such, the probe card 50 includes an arm 130 that can be raised or lowered so as to selectively be brought into proximity with the submount assembly 82. An alignment controller 132 (FIG. 1B) having x, y, and z-linear stages is included and configured to selectively align the probe card arm 130 with the submount assembly 82 on the mounting portion 80. Thus, the alignment controller 132, in conjunction with movement of the translation platform 72, can ensure that proper alignment is achieved between the probe card 50 and first testing site 30 before testing is commenced.

An electrical contact portion 134 is included on the probe card arm 130 and is configured to provide the electrical supply to the mounting portion 80 when the arm is in its lowered position atop the mounting portion 80. Specifically, the electrical contact portion 134 is provided a suitable electrical supply via an electrical cable/connector 136 and is configured to electrically connect with the contacts 150, similar to those shown at 150 in FIG. 4, disposed on the mounting portion 80 of the first testing site 30 when then the probe card arm 130 is lowered atop the mounting portion. The electrical contact portion 134 engages the submount assembly 82 with sufficient force to enable such electrical connection to occur. The contacts 150 of the mounting portion 80 are in turn electrically connected to conductive features present on the submount assembly 82 as further detailed below in connection with FIG. 4, which features electrically connect with the laser die.

Thus, when an electrical supply is provided to the submount assembly 82 via the probe card arm electrical contact portion 134 and mounting portion 80, the laser die is provided an electrical supply, which enables it to be operated for testing purposes. The specific configuration of the electrical contact portion 134 of the probe card arm and the electrical contacts and paths of the mounting portion 80 can vary according to the specific design of the submount assembly 82.

Note that the probe card and first testing site configuration as described above is similar to interaction of the probe card with the second and third testing sites as well. Thus, a submount assembly positioned in any one of the testing sites can be electrically connected with the probe arm as described above in order to permit functionality of the laser die included thereon, provided that the translational platform 72 is moved into proper alignment with the probe card 50. Also, recall that the position of the probe arm 50 can be modified by fine positioning control of the alignment controller 132 in order to precisely align the probe card arm 130 and electrical contact portion 134 thereof with the electrical features of the mounting portion of the respective testing site so as to ensure that a sufficient electrical supply is provided the laser die. Further, a contact sensor (not shown) can be provided on the probe card arm 130 or electrical contact portion 134 to ensure that consistent probe arm contact is made.

As best shown in FIGS. 2A, 2B, and 5, the aligner 60 is employed to accurately and automatically position an optical fiber 146 with respect to the laser die positioned on the submount assembly 82, which in turn is positioned on a mounting portion of one of the testing sites, such as the mounting portion 80 of the first testing site 30, as shown. This enables the optical fiber 146 to optically couple with light emissions from the laser. This in turn enables optical output of the laser to be evaluated during this characterization process, in preparation for inclusion of the laser in an optical component, such as an optical transmitter. Note that the description of operation of the aligner with respect to the first testing site equally applies to its use with the second and third testing sites as well. As illustrated, the aligner 60 (see also FIG. 1B) includes a support arm 140 that extends from an alignment controller 132 toward the mounting portion 80 of the first testing site 30. The support arm 140 is operably connected to the alignment controller 142. The alignment controller 142 includes x, y, and z linear stages such that the controller can move the support arm with respect to the mounting portion 80 in order to precisely position a lens assembly interface 144 according to an optical power feedback functionality of the lens assembly interface 144 with respect to light output from the laser die. The lens assembly interface 144 is configured to receive the light emission from the laser die and launch the emissions into the optical fiber 146. As such, the alignment controller 142 is configured to move in four dimensions (x, y, z, and rotational) with respect to the laser die in order to properly optically couple light emission from the laser with the lens assembly interface. As its name implies, the lens assembly interface 144 includes one or more lenses to properly focus the light received from the laser die in order to launch the light into the optical fiber 146.

Operation of the aligner 60 in optically aligning the lens assembly interface 144 with the laser die in one embodiment is automatic such that no direct human intervention is required during the alignment process. This automation can be provided by the placement controller 142 itself, or by a master controller device or computer (not shown) that can govern not only the aligner 60, but the other components of the system 10 as well. Such a controller can also be employed to automatically govern component functions, including the temperature at each testing site, etc.

As mentioned above, the indexer 20 is employed to selectively move the first, second, and third testing sites atop the translational platform 72. The indexer 20 is employed, together with the placement robot 70, to load and unload submount assemblies to and from a respective one of the testing sites 30, 35, and 40, before or after laser die testing. As mentioned, the pick-and-place placement robot 70 in one embodiment is vision-guided and is configured for movement in four axes (x, y, z, and rotational) in order to be able to accurately place and remove the submount assembly from the mounting portion of a respective testing site.

Figure 4:
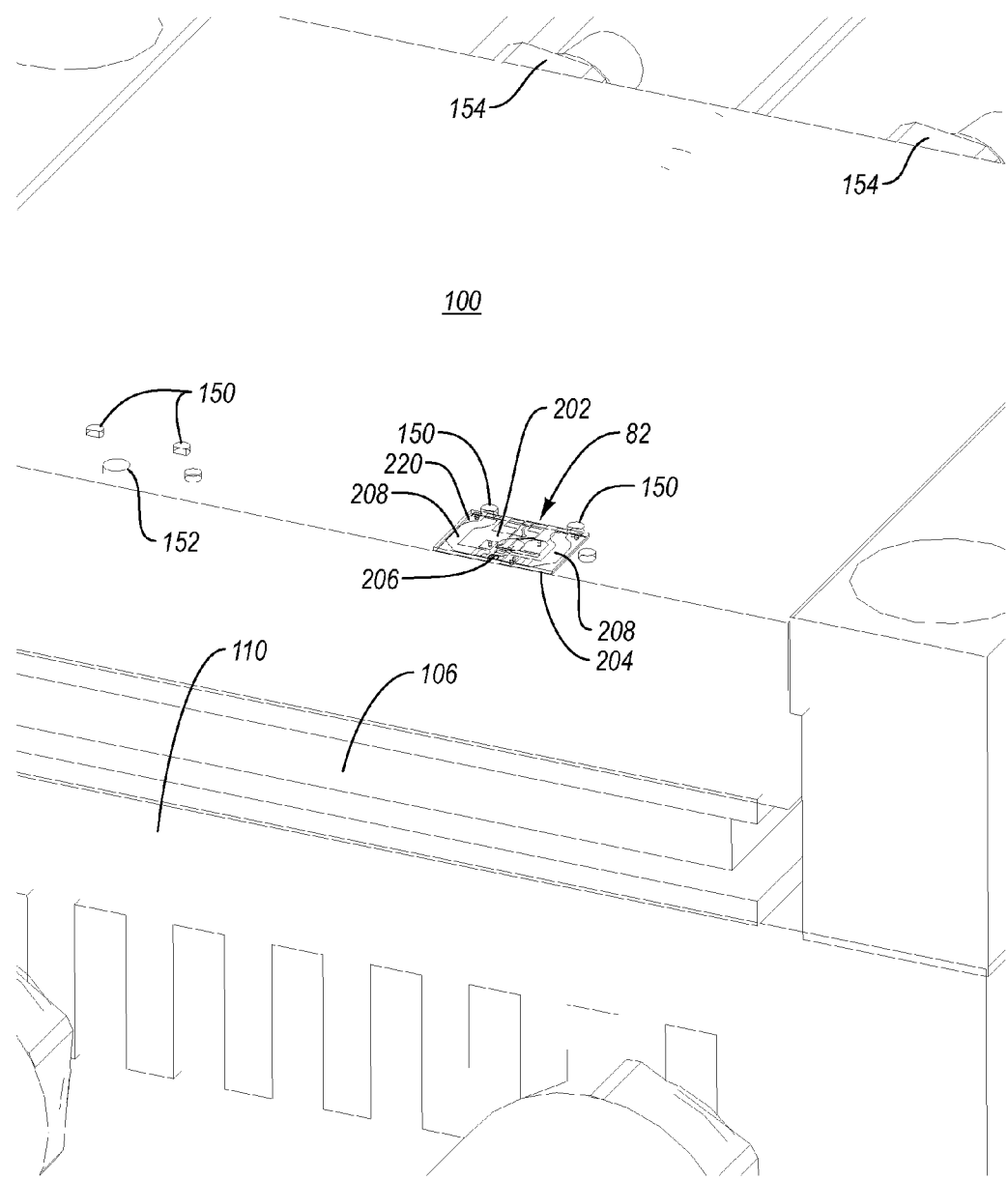
FIG. 4 is a close-up view of a mounting surface of the second testing site, showing various features thereof, according to one embodiment.

FIG. 4 shows various details regarding the manner in which the submount assembly 82 is positioned on the mounting portion of one of the testing sites, in this case, the second testing site 35. In particular, the submount assembly 82 includes a submount 200 having a top surface 202 and bottom surface 204. The submount top surface 202 includes a laser die 206 electrically connected to conductive pathways 208.

The submount assembly 82 is positioned on the mounting portion 100 at one of two predetermined locations on the mounting portion surface. Each predetermined location includes a vacuum hole 152 that holds by suction the submount assembly 82 when the assembly is positioned on the mounting portion 100 such that the bottom submount surface 204 covers the vacuum hole. Each vacuum hole 152 is in communication with one of two vacuum inlets 154 extending from the second testing site 35. The suction force provided by the vacuum system 156 (FIG. 1B) via the corresponding vacuum hole 152 keeps the submount assembly 82 in place at one of the two sites on the surface of the mounting portion 100 in preparation for the laser die characterization method described below. Of course, more or less than two submount assembly position sites can be included on either or all of the mounting portions included in the system 10.

Operation of the system 10 in characterizing a laser die or other light source according to one embodiment can generally proceed as follows: the submount assembly 82 on which the laser die has already been mounted is loaded by the placement robot 70 on to a selected one of the three testing sites 30, 35, and 40. In the present example, the submount assembly 82 is automatically loaded on to the mounting portion 80 of the first testing site 30. The indexer 20 then moves the translational platform 72 until the first testing site 30 is positioned adjacent the probe card 60. The probe card arm 130 is lowered, and adjusted if needed by the alignment controller 132, until the electrical contact portion 134 of the arm electrically connects with the contacts 150 of the mounting portion 80, or directly with electrical features of the submount assembly 82 in an alternative embodiment. In this way, the position of the submount assembly 82 is verified prior to testing.

Either before, during, or after it is positioned adjacent the probe card 50, the first testing site 30 is brought to a desired temperature in order to test the laser die at that temperature. In one embodiment, the first testing site 30 is cooled to a temperature below room temperature, but in other embodiments, the temperature can be maintained at higher or lower temperatures. This enables the laser die to be tested in conditions it may face during its operational lifetime.

The aligner 60 is also brought into proximity with the now-positioned testing site 30. With the submount assembly 82 being electrically energized by the probe arm 50, the laser die can be activated such that it emits a light signal. The lens assembly interface 144 of the support arm 140 can then be automatically and accurately positioned by the alignment controller 142 such that reception of the light signal of the laser die by the lens assembly interface can be maximized. Again, this process occurs automatically by the aligner 60, and by a master controller in some embodiments.

Once sufficient optical coupling exists between the laser die and the lens assembly interface 144, testing and characterization of the laser die at the specified temperature can occur. Once testing is complete, the probe card arm 130 is removed from top the mounting portion 80, the support arm 140 of the aligner 60 is retracted as needed, and the indexer 20 is activated to move the translational platform 72 to a position where the placement robot 70 can remove the submount assembly 82 from the first testing site 30 and move it to another testing site, the load/unload station, or some other predetermined location.

At this point, another submount assembly can be placed in the first testing site 30 and the above process repeated. Alternatively, the placement robot 70 can place the submount assembly 82 just tested in the first testing site 30 in the second testing site 35. In the latter case, the indexer 20 is then moved to position the second testing site 35 proximate the probe card 50. The above testing process then proceeds as described above. However, the laser die of the submount assembly 82 is preferably tested in the second testing site at a temperature distinct from that maintained at the first testing site 30, in this case. For example, if the first testing site 30 tested the laser die at a temperature below room temperature, the second testing site 35 can test the same laser die at a temperature above room temperature.

The above process can be repeated a third time to test the laser die of the submount assembly 82 at the third testing site 40, at ambient (room) temperature. In this way, the laser die is able to be automatically and accurately tested at three distinct temperatures, thereby ensuring the stability and performance of the laser die before its inclusion in an optical device. This in turn improves yield and reduces cost while reducing the number of in-field scrap rates due to malfunctioning laser dies.

In one embodiment, different submount assemblies can be loaded into each of the testing sites by the placement robot 70, and each submount assembly can be tested consecutively before all three assemblies are returned by the indexer to the robot. Or, the system in one embodiment can include multiple probe cards and aligners such that testing at the testing sites can occur simultaneously. Though described here as a laser die, the light source could be of other types, including an LED, in one embodiment. The system could also be adapted so as to be able to test a laser die while still connected to adjacent laser dies in a laser bar configuration, for instance, or even laser dies already mounted within a header assembly.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A temperature-controlled system for testing a laser die mounted on a submount, the system comprising:
 a base having a motor-driven translation platform, the translation platform including:
  at least a first testing site including:
   a base portion;
   a two-stage temperature control system mounted on the base portion and having:
    a thermoelectric cooler; and
    a fluid system for circulating a cooling/heating fluid;
   a mounting portion on which the submount is positioned for testing, a temperature of the mounting portion being selectively controlled by the temperature control system;

a probe card having a movable arm and an electrical contact portion attached to the arm for providing a power supply to the submount when the first testing site is aligned with the probe card; and an aligner having a lens assembly that is alignable with the first testing site so as to receive an optical signal produced by the laser die.

2. The system for testing as defined in claim 1, further comprising a vacuum control system, the vacuum control system including a hole defined in the mounting portion that provides suction so as to secure the submount to the mounting portion.

3. The system for testing as defined in claim 1, wherein the lens assembly of the aligner is automatically alignable by x, y, and z linear stages.

4. The system for testing as defined in claim 1, wherein the probe card is alignable by x, y, and z linear stages.

5. The system for testing as defined in claim 1, further comprising a second and a third testing site.

6. The system for testing as defined in claim 5, wherein the second testing site includes a two-stage temperature control system, and wherein the third testing site includes a single-stage temperature control system.

7. The system for testing as defined in claim 1, wherein the two-stage temperature control system of the first testing site enables the mounting portion to temperature to vary between −40 and 100 degree Celsius.

8. The system for testing as defined in claim 1, wherein the fluid system includes inlet and outlet tubes for circulating a cooling/heating fluid within a circulation block.

9. A method, by a testing system, for testing a laser die mounted on a submount, the testing system including at least a first testing site having a two-stage temperature control system, the method comprising:

securing the submount on a mounting portion of the at least first testing site;

aligning the at least first testing site with a probe card such that the probe card provides a power supply to power the laser die;

aligning a lens assembly with the submount assembly such that an optical signal produced by the laser die is received by the lens assembly; and testing the laser die at a first temperature produced by the two-stage temperature control system of the at least first testing site.

10. The method for testing as defined in claim 9, further comprising:

testing the laser die at a second temperature produced by the two-stage temperature control system of the at least first testing site.

11. The method for testing as defined in claim 9, further comprising:

testing the laser die at a second testing site at a second temperature.

12. The method for testing as defined in claim 11, further comprising:

testing the laser die at a third testing site at a third temperature.

13. The method for testing as defined in claim 9, wherein securing the submount on a mounting portion of the at least first testing site further comprises using a placement robot to secure the submount on the mounting portion.

14. The method for testing as defined in claim 13, wherein the placement robot automatically transfers the submount from a load/unload station to the mounting portion.

15. The method for testing as defined in claim 9, wherein securing the submount on a mounting portion of the at least first testing site further comprises utilizing a vacuum to secure the submount on the mounting portion.

16. The method for testing as defined in claim 9, wherein aligning the at least first testing site with the probe card includes moving a translation platform on which the first testing site is mounted, and includes moving the probe card with respect to first testing site.

17. The method for testing as defined in claim 9, wherein the lens assembly is included with an aligner, the aligner being automatically alignable with the laser die of the submount according to an optical signal produced by the laser die.

18. The method for testing as defined in claim 9, wherein the probe card provides a power supply to the laser die via contacts included on the mounting portion, the contacts being electrically connected with the submount.

19. A testing system for testing a laser source mounted on a submount assembly, the testing system comprising:

an indexer stage, including:

a first testing site having a mounting portion on which the submount assembly can be positioned, the first testing site including a two-stage temperature control system that is configured to maintain the submount assembly at a first temperature;

a second testing site having a mounting portion on which the submount assembly can be positioned, the second testing site including a two-stage temperature control system that is configured to maintain the submount assembly at a second temperature; and a third testing site having a mounting portion on which the submount assembly can be positioned, the third testing site enabling the submount assembly to be maintained at an ambient temperature;

a probe card stage that includes an electrical contact portion that selectively engages the mounting portion of a selected one of the testing sites having a submount assembly positioned thereon, the electrical contact portion providing an electrical supply to the light source of the submount assembly; and an aligner stage that is capable of automatically aligning a lens assembly with the light source of the submount assembly such that an optical signal produced by the light source is received by an optical fiber optically coupled to the lens assembly.

20. The testing system as defined in claim 19, wherein the third testing site includes a thermoelectric cooler for selectively adjusting the temperature of the submount assembly.

* * * * *